DIODE GATE CIRCUIT

Filed Dec. 22, 1958

INVENTOR.
JACOB M. SACKS
BY

United States Patent Office 2,931,919

Patented Apr. 5, 1960

2,931,919

DIODE GATE CIRCUIT

Jacob M. Sacks, Rolling Hills, Calif., assignor to the United States of America as represented by the Secretary of the Navy Application December 22, 1958, Serial No. 782,336

3 Claims. (Cl. 307—88.5)

Figure 1:
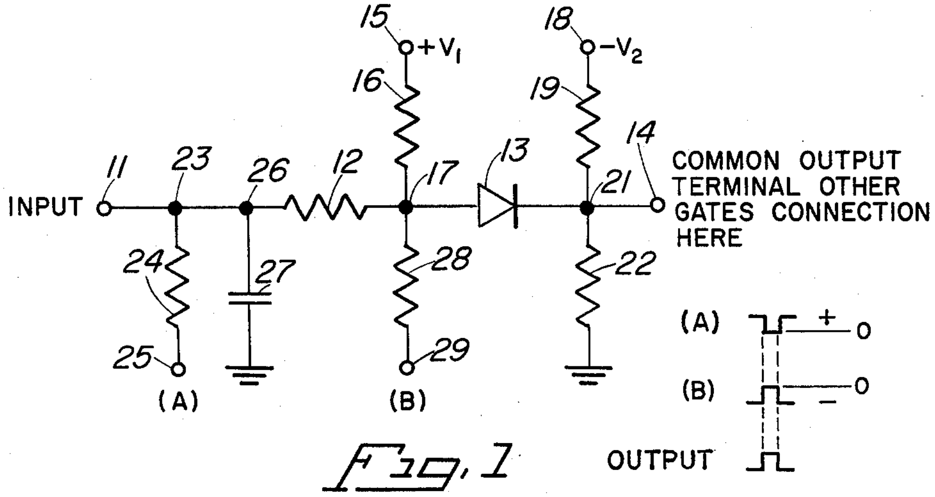

(Granted under Title 35, U.S. Code (1952), sec. 266)

The invention described herein may be manufactured and used by or for the Government of the United States of America for governmental purposes without the payment of any royalties thereon or therefor.

This invention relates to a diode gate circuit and more particularly to a gate circuit utilizing only one diode and adapted to provide an output voltage, when the gate is turned on, which is directly proportional to the analog signal at the input, and wherein substantially none of the input appears at the output, when the gate is turned off.

Many different gating circuits have been proposed, but all of these have certain drawbacks or disadvantages, particularly when utilized in telemetering circuits for which the present invention is intended. In these prior gating circuits the output is frequently not a linear function of the input, and unless silicon rectifiers are used, other circuits may result in cross modulation between more than one channel, if their outputs are common. If silicon diodes are used in conventional circuits, the input-output characteristics are not linearly related in the input voltage range below about one volt, due to diode characteristics. Other gates display switching transients at the output, when turned on or off, and other gates allow some of the switching wave form to appear at the input, thereby getting into the source of voltage.

In one preferred embodiment of the present invention a silicon diode is oriented in its forward direction between the input and output terminals. Positive and negative bias voltages are applied through resistances to junction points on the input and output sides of the diode respectively. A resistance is connected in series between the input and the diode, and gating voltages of opposite polarity are applied through resistances to the terminals of the series resistance, with a negative voltage being applied between the diode and the series resistance and a positive voltage being applied between the series resistance and the input.

When both of these gating voltages are brought to ground potential, the diode conducts even though the input voltage is zero. Under these conditions, assuming the forward resistance of the diode is much less than the resistance of the biasing circuit, the common output will be at approximately zero potential. If the input terminal is at a positive potential, the output terminal will be at a potential of some predetermined fraction of the input potential and thus the output voltage will vary linearly with the input voltage.

A capacitor connected between the input and the series resistance to ground will by-pass short duration switching transients due to whatever slight differences may exist between the gating wave forms.

One object of the present invention is to provide a silicon diode gate circuit wherein the analog output voltage is directly proportional and the linear function of the analog signal at the input even where the input voltage is very low.

Another object of the present invention is to provide a diode gating circuit which does not display switching transients at the output when turned on or off.

A still further object of the present invention is to provide the diode gate circuit which does not allow the switching wave form to appear at the input and thereby get into the source of voltage.

A still further object of the present invention is to provide a silicon diode gate circuit which is simple, requiring only one diode per gate, and is also reliable and operable at high ambient temperatures.

Figure 2:
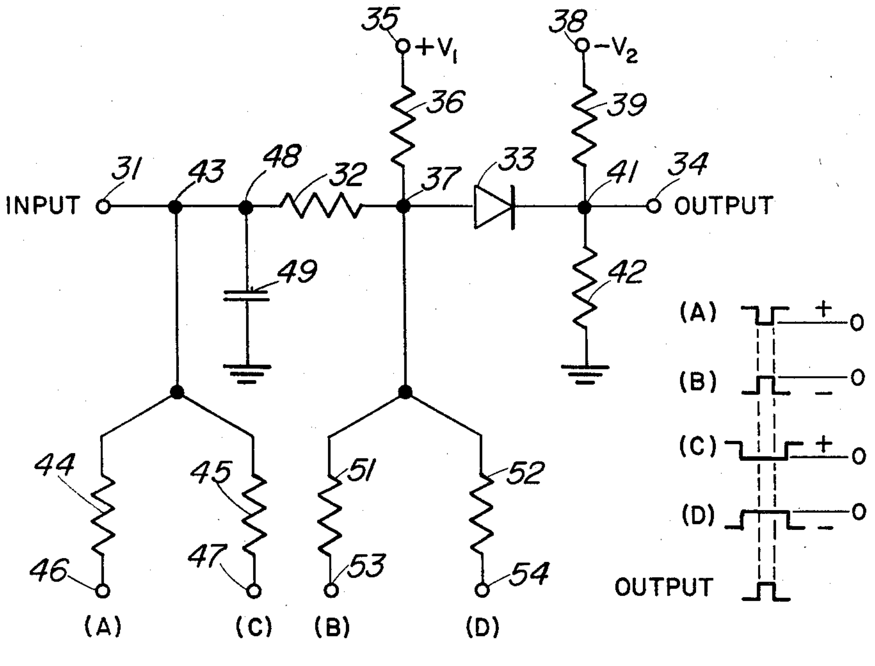

Other objects and many of the attendant advantages of this invention will be readily appreciated as the same becomes better understood by reference to the following detailed description when considered in connection with the accompanying drawings wherein:

Fig. 1 is a schematic circuit diagram illustrating one preferred embodiment of the present invention which allows the gate to operate when two terminals are simultaneously grounded; and Fig. 2 is a schematic circuit diagram which allows the gate to operate only when four terminals are simultaneously grounded.

Referring now to the drawings in detail and more particularly to Fig. 1 wherein one preferred embodiment of the diode gating circuit of the present invention is illustrated, an input signal consisting of an analog voltage is applied to the terminal 11.

A resistance 12 and a diode 13 are connected in series between the input terminal 11 and an output terminal 14 which is a common output terminal adapted to be connected to other gates similar to the one shown to provide a commutated signal from a number of different input sources. Diode 13 is preferably a silicon diode, but may be any other type of semi-conductor diode having analogous characteristics.

A positive bias voltage is applied to the bias terminal 15 and is connected through a resistance 16 to a junction 17 between the resistance 12 and the diode 13. Another negative bias voltage is applied to the bias terminal 18 and through a resistance 19 to a junction 21 between the diode 13 and the output terminal 14. The junction 21 is also connected through a resistance 22 to ground.

Another junction 23 is connected through a resistance 24 to a positive gating terminal 25, and the junction 26 between the input 11 and the resistance 12 is connected through a condenser 27 to ground. The junction 17 is also connected through a resistance 28 to a negative gating terminal 29.

The terminals 25 and 29 are adapted to have the gating voltages (A) and (B) applied thereto from a suitable source such as the transistor bistable multivibrator illustrated in Fig. 3 of the co-pending application of Jacob M. Sacks, Serial No. 680,031, filed August 23, 1957.

The positive voltage is applied to the terminal (A) and the negative voltage is applied to the terminal (B). The gate is allowed to operate only when the terminals (A) and (B) are simultaneously grounded as indicated by the pulse diagrams of Fig. 1.

In the operation of the gating circuit with the terminals (A) and (B) connected as indicated to the output terminals of a suitable pulse generator circuit, the terminal 25 is positive with respect to ground and the terminal 29 is negative. Under these conditions the diode 13 does not conduct, since the resistance 16, resistance 19, and resistance 12 in conjunction with the bias potentials, plus $V_1$ and minum $V_2$, applied to the terminals 16 and 18 bias the diode 13 in the back direction. However, when the gating pulses (A) and (B) are applied to the terminals 25 and 29 respectively, so that these points are brought to ground potential, the diode 13 conducts with a magnitude of the current being a function of the input terminal voltage.

If the input voltage is zero conduction occurs by virtue of the positive bias, plus $V_1$, and the negative bias, minus $V_2$, which are assumed to be equal to one another in magnitude, but opposite in sign. Under these conditions, assuming that the forward resistance of the diode 13 is much less than the value of the resistances 16 and 19, the common output will be approximately zero potential. If the input terminal is at a positive potential, the output terminal will be at a potential of some predetermined fraction of the input potential. Therefore, the output voltage will vary linearly with the input voltage.

The voltage (A) applied to the terminal 25 becomes zero simultaneously with the voltage (B) which is applied to the terminal 29. Since the width of these two wave forms are identical, and their amplitudes are proportioned (ideally equal), it is possible to select a value for the resistance 24 which will allow the voltage at the open circuit input due to the wave form (B) at the terminal 29 to be canceled by the wave form (A) at the terminal 25 for all conditions. In other words, the gating wave forms will not cause transient or steady state currents to flow out through the input terminal and the instrumentation source. The capacitor 27 functions to by-pass short duration switching transients due to whatever slight differences may exist between the wave forms (A) and (B).

While the circuit illustrated in Fig. 1 will obviously function with many different values of voltage, resistance and capacitance, depending on the particular application, one particular set of values is given to illustrate one specific application of the invention to a telemetering gating circuit.

| | |
|---|---|
| Resistances 16 and 19 | 560K |
| Resistances 28 and 22 | 120K |
| Resistance 12 | 100K |
| Resistance 25 | 300K |
| Capacitor 27 ____ μf__ | .01 |
| Bias voltage $V_1$ ____ volts__ | +30 |
| Bias voltage $V_2$ ____ do____ | −30 |
| Gating voltage (A) ____ do____ | +25 |
| Gating voltage (B) ____ do____ | −25 |

It will be apparent that using the above values of voltage and resistance and with the gating voltages applied to the terminals 25 and 29, as illustrated, and the bias voltages plus $V_1$ and minus $V_2$ applied to the terminals 15 and 18, the junction point 17 will be negative with respect to the junction 21 and therefore no current will flow through the diode 13. When the pulses (A) and (B) are applied to the terminals 25 and 29 bringing these points to ground potential, then the junction points 17 and 21 will both be at ground potential thus providing a zero potential at the common output terminal 14. Any voltage which appears at the input terminal 11 will cause more current to flow through the diode 13 in a forward direction, and the output terminal will be at a potential of some predetermined fraction of the input potential.

One modification of the present invention is illustrated in the circuit of Fig. 2 which is very similar to the circuit of Fig. 1 except for the fact that two gating terminals are connected adjacent the input and two other gating terminals are connected adjacent the diode, so that the gate will only operate when all four of the terminals are simultaneously grounded.

In the circuit of Fig. 2 the input signal is applied to the terminal 31 which is connected through the resistance 32 and silicon diode 33 to the output terminal 34. A bias voltage plus $V_1$ is applied to the terminal 35 and through a resistance 36 to the junction 37. The negative bias voltage minus $V_2$ is applied to the terminal 38 and through the resistance 39 to the junction 41. Junction 41 is connected through the resistance 42 to ground.

A junction 43 adjacent the input terminal 31 is connected through the resistances 44 and 45 to the terminals 46 and 47 respectively. The junction 48 is connected through the condenser 49 to ground. Terminal 37 adjacent the diode 33 is connected through the resistances 51 and 52 to the terminals 53 and 54 respectively. In this modification of the invention the terminals 46 and 47 have a positive voltage applied thereto and the terminals 53 and 54 have a negative voltage applied thereto, thus requiring that all four of the voltages (A), (B), (C) and (D) be brought to ground potential simultaneously. As will be apparent from the wave forms illustrated in Fig. 2 the pulses (C) and (D) are of somewhat longer duration than the pulses (A) and (B), but the output pulse will only occur during the coincidence of the short duration pulses (A) and (B).

In all other respects the circuit in Fig. 2 functions in the same manner as the circuit of Fig. 1 which has been described supra.

Obviously many modifications and variations of the present invention are possible in the light of the above teachings. It is therefore to be understood that within the scope of the appended claims the invention may be practiced otherwise than as specifically described.

What is claimed is:

1. A diode gating circuit comprising a resistance and a semi-conductor diode in series between the input and output terminals, a positive bias terminal connected through a resistance to a first junction point between said first resistance and diode, a negative bias terminal connected through a resistance to a second junction point between said diode and output terminal, a resistance connected between said second junction point and ground, a resistance connected to said first junction point and a negative gating terminal, and a resistance connected to a junction adjacent said input terminal and to a positive gating terminal, said gating terminals being adapted to be connected to a suitable pulse generator circuit which will simultaneously bring both gating voltages to ground potential for a short duration.

2. A diode gating circuit comprising a resistance and a semi-conductor diode in series between the input and output terminals, a positive bias terminal connected through a resistance to a first junction point between said first resistance and diode, a negative bias terminal connected through a resistance to a second junction between said diode and output terminal, a resistance connected between said second junction point and ground, a resistance connected between said first junction point and a negative gating terminal, a resistance connected between a third junction point adjacent said input terminal and a positive gating terminal, and a condenser connected between a junction point adjacent said input terminal and ground, said gating terminals being adapted to be connected to a suitable pulse generator circuit which will simultaneously bring both gating voltages to ground potential for a short duration.

3. A diode gating circuit comprising a resistance and a silicon diode in series between the input and output terminals, a positive bias voltage connected through a resistance to a first junction point between said first resistance and diode, a negative bias voltage connected through a resistance to a second junction point between said diode and output terminal, a resistance connected between said second junction point and ground, a resistance connected between said first junction point and a negative gating terminal, a resistance connected between a junction point adjacent said input terminal and a positive gating terminal, a condenser connected between a junction point adjacent said input terminal and ground, and means for applying gating voltages to said gating terminals and simultaneously bringing both gating voltages to ground potential for a short duration.

References Cited in the file of this patent

UNITED STATES PATENTS

| | | |
|---|---|---|
| 2,466,959 | Moore | Apr. 12, 1949 |
| 2,798,153 | Dougherty et al. | July 2, 1957 |
| 2,802,954 | Graham et al. | Aug. 13, 1957 |
| 2,817,772 | Lee | Dec. 24, 1957 |